United States Patent [19]

Soraoka et al.

[11] Patent Number: 5,085,750

[45] Date of Patent: * Feb. 4, 1992

[54] PLASMA TREATING METHOD AND APPARATUS THEREFOR

[75] Inventors: Minolu Soraoka, Kudamatsu; Yoshinao Kawasaki, Yamaguchi; Katsuyoshi Kudo; Tsunehiko Tsubone, both of Kudamatsu, all of Japan

[73] Assignee: Hitachi, Ltd., Tokyo, Japan

[*] Notice: The portion of the term of this patent subsequent to Sep. 11, 2007 has been disclaimed.

[21] Appl. No.: 338,038

[22] Filed: Apr. 14, 1989

[30] Foreign Application Priority Data

Apr. 20, 1988 [JP] Japan ............... 63-95601

[51] Int. Cl.$^5$ ............... B44C 1/22; H01L 21/306; C03C 15/00
[52] U.S. Cl. ............... 204/192.32; 156/345; 156/643; 156/646; 204/298.33; 204/298.09; 204/298.38
[58] Field of Search ............... 156/345, 643, 646; 204/298.31, 298.33, 298.37, 298.38, 192.12, 192.32, 298.09; 427/38; 118/723, 724

[56] References Cited

U.S. PATENT DOCUMENTS

| 4,522,674 | 6/1985 | Ninomiya et al. ............... 156/345 |
| 4,526,644 | 7/1985 | Fujiyama et al. ............... 156/345 |
| 4,664,747 | 5/1987 | Sekiguchi et al. ............... 156/345 X |
| 4,668,365 | 5/1987 | Foster et al. ............... 156/345 X |
| 4,689,112 | 8/1987 | Bersin ............... 156/345 X |
| 4,705,595 | 11/1987 | Okudaira et al. ............... 156/345 X |
| 4,771,730 | 9/1988 | Tezuka ............... 156/345 X |
| 4,911,812 | 3/1990 | Kudo et al. ............... 204/192.32 |
| 4,956,043 | 9/1990 | Kanetomo et al. ............... 204/298.09 X |

FOREIGN PATENT DOCUMENTS 60-58627 8/1985 Japan ............... 204/298.09

*Primary Examiner*—Nam X. Nguyen
*Attorney, Agent, or Firm*—Antonelli, Terry, Stout & Kraus

[57] ABSTRACT

The present invention relates to a plasma treating method and apparatus therefor, the plasma treating method comprising the steps of supplying a liquid refrigerant whose temperature is not higher than 0° C. into a specimen table having a specimen place surface, cooling a specimen placed on the specimen place surface, treating the cooled specimen utilizing a gas plasma, and recovering the liquid refrigerant, in its liquid state, retained in the specimen table from the specimen table. The plasma treating apparatus comprised means for producing a gas plasma, a specimen table on which is placed a specimen to be treated utilizing the gas plasma and interiorly formed with a space for retaining a liquid refrigerant whose temperature is not higher than 0° C., means for supplying the liquid refrigerant to the space, and means for recovering the liquid refrigerant, in its liquid state, to the liquid refrirant supplying means, whereby an increase in consumption quantity of the liquid refrigerant can be suppressed, and thus an increase in operating cost of the apparatus can be suppressed.

9 Claims, 2 Drawing Sheets

PLASMA TREATING METHOD AND APPARATUS THEREFOR

BACKGROUND OF THE INVENTION

1. Field of the Invention

The present invention relates to a plasma treating method and apparatus therefor, and more particularly to a plasma treating method and apparatus therefor which is suitable for etching and film-forming treatment such as a specimen of a substrate of a semiconductor utilizing a gas plasma while controlling a temperature thereof to a low level not higher than 0° C.

2. Description of the Prior Art

In prior art for effecting etching and film-forming treatment utilizing a gas plasma while controlling a temperature of a substrate of a semiconductor element or the like to a low temperature not higher than 0° C., a liquid refrigerant, for example, liquid nitrogen, a liquified fluorine compond, liquid helium, etc. having a temperature not higher than 0° C. is supplied into a specimen table on which a specimen is placed to cool the specimen table, and a temperature of the specimen is controlled to a predetermined low temperature not higher than 0° C.

Documents relevant to the art of the kind as described above are, for example, unexamined published Japanese Patent Application No. 240635/1986, unexamined publication Japanese Utility Model Application No. 103249/1987 and so forth.

For example, in the case where the apparatus stops or is out of operation when the apparatus is maintained and checked, the liquid refrigerant retained within the specimen table is discharged outside the table. However, in the aforementioned prior art, recovery of the liquid refrigerant from the specimen table is not at all taken into consideration. That is, the liquid refrigerant is wastefully discarded outside the specimen table and therefore, the quantity of liquid refrigerant consumed increases to increase the operation cost of the apparatus. In addition, for example, the treating chamber interiorly provided with the specimen table is sometimes opened to the atmosphere for maintenance and check of the apparatus. However, in such a case, when the specimen table cooled to a low temperature not higher than 0° C. is exposed to the atmosphere in that state, moisture or the like in the atmosphere is adsorbed by the specimen table. This gives rise to problems in that time required for pressure reduction and exhaust within the treating chamber after maintenance and check of the apparatus is extended and that the interior of the treating chamber cannot be reduced to a predetermined pressure as the case may be. This problem similarly occurs, for example, in the case where nitrogen gas or the like is sealed into the treating chamber until the next day's operation starts, the specimen table cooled to a low temperature not higher than 0° C. is maintained in that state and the operation of the apparatus is stopped.

SUMMARY OF THE INVENTION

A principal object of the present invention is to provide a plasma treating method and apparatus therefor for effecting treatment utilizing a gas plasma while controlling a temperature of a specimen not higher than 0° C., which can carry out, in a good manner, pressure reduction and exhaust within a treating chamber after stoppage or suspension of operation of the apparatus.

The above-described principal object is achived by a plasma treating method comprising the steps of supplying a liquid refrigerant whose temperature is not higher than 0° C. into a specimen table having a specimen place surface, cooling a specimen placed on the specimen place surface, treating the cooled specimen utilizing a gas plasma, discharging the liquid refrigerant retained within said specimen table outside said specimen table, and returning a temperature of the specimen table from which the liquid refrigerant is discharged from a temperature lower than 0° C. to a temperature under atmospheric pressure higher than a dew point temperature of an atmospheric gas around the specimen table, and by a plasma treating apparatus comprising means for producing a gas plasma, a specimen table on which is placed a specimen to be treated utilizing gas plasma and interiorly formed with a space for retaining a liquid refrigerant whose temperature is not higher than 0° C., means for supplying the liquid refrigerant to the space, means for discharging the liquid refrigerant present in the space outside the specimen table, and means for returning a temperature of the specimen table from which the liquid refrigerant is discharged from a temperature lower than 0° C. to a temperature higher than a dew point temperature under atmospheric pressure of an atmospheric gas within a treating chamber interiorly provided with the specimen table.

DESCRIPTION OF THE PREFERRED EMBODIMENTS

A liquid refrigerant, for example, a liquefied fluorine compound, liquefied hydrocarbon, liquid nitrogen, liquid helium, etc. whose temperature is not higher than 0° C., is supplied from liquid regrigerant supplying means to an internal space of a specimen table to thereby cool the specimen table to a temperature not higher than 0° C. The specimen placed on the specimen table is cooled and adjusted to a predetermined temperature not higher than 0° C. through the specimen table. Such a specimen is treated as required utilizing a gas plasma produced by gas plasma producing means. On the other hand, in the case where the liquid refrigerant retained in the internal space of the specimen table must be discharged from the internal space of the specimen table, the liquid regrigerant retained in the internal space of the specimen table is recovered in its liquid state from the specimen table to the liquid refrigerant supplying means by liquid refrigerant recovering means. The liquid refrigerant recovered in the liquid refrigerant supplying means is re-supplied from the liquid refrigerant supplying means to the internal space of the specimen table. Accordingly, in such a case, the liquid refrigerant is not wastfully discarded outside the specimen table but recovered in the liquid state and, therefore, an increase in consumption quantity of liquid refrigerant and thus an increase in operation cost of apparatus can be suppressed. It is noted that if design is made so that the liquid refrigerant present in the internal space of the specimen table is forcibly discharged outside the speciment table, the liquid refrigerant discharging time can be shortened, and the lowering of an operating efficiency and thus the lowering of a throughput can be suppressed.

The liquid refrigerant present in the internal space of the specimen table is discharged outside the specimen table by liquid refrigerant discharging means. A temperature of the specimen table with the liquid refrigerant discharged from the internal space is returned by temperature returning means to a temperature higher than a dew point temperature of an atmospheric gas around the specimen table. Accordingly, in such a case, even if the specimen table is exposed to atmosphere, adsorption of moisture or the like in the atmosphere to the specimen table can be prevented, and pressure reduction and exhaust within the treating chamber after stoppage or suspension of operation the apparatus can be carried out in a good manner.

One embodiment of the present invention will be described with reference to FIG. 1.

Figure 1:
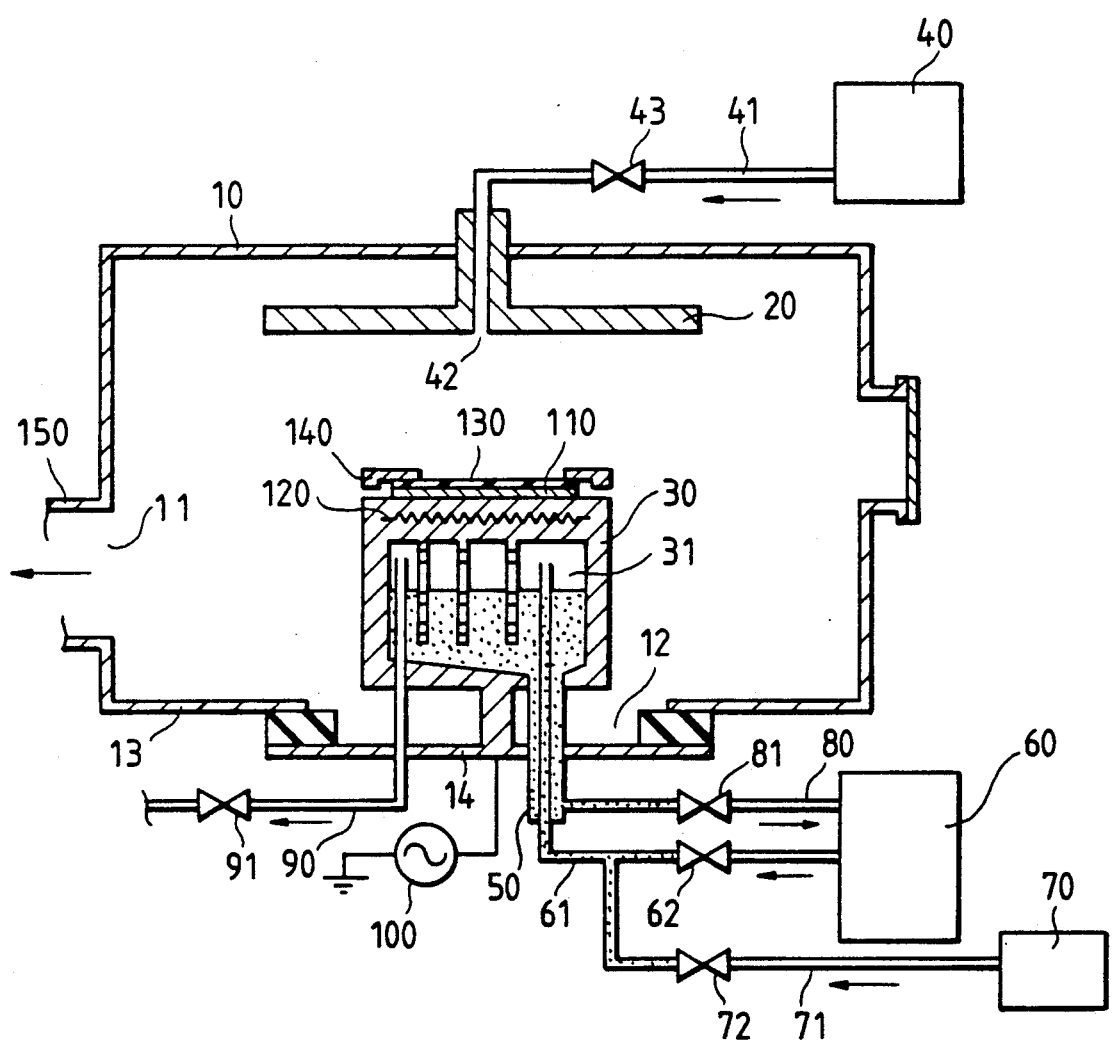
FIG. 1 is a structural view of a plasma etching apparatus according to one embodiment of the present invention.

In FIG. 1, an etching chamber 10 which is a treating chamber is interiorly provided with electrodes 20 and 30, which in this case, are vertically opposed to each other. The etching chamber 10 is formed having a side wall, in this case, with an exhaust vent 11. The pressure reducing and exhausting means employed include well-known means composed of a vacuum pump (not shown), a variable conductance valve (not shown), an exhaust pipe 150, and so forth. The exhaust pipe 150 has one end connected to the exhaust vent 11 and the other end connected to an intake vent of the vacuum pump. The variable conductance valve is provided on an exhaust pipe 150. The etching gas supplying means is composed, in this case, of a gas supplying device 40 comprised of an etching gas source and a gas flow control device, a gas supplying pipe 41, a gas supplying passage 42 and a gas supplying valve 43. The gas supplying device 40 is installed externally of the etching chamber 10. The gas supplying passage 42 is formed with the electrode 20. One end of the gas supplying passage and the gas supplying device 40 are connected by the gas supplying pipe 41. The gas supplying valve 43 is provided on the gas supplying pipe 41. The other end of the gas supply passage 42 is opened toward the specimen place surface of the electrode 30. The electrode 30 is interiorly formed with a space 31. One end of a liquid refrigerant discharge pipe 50 is connected to the bottom of the electrode 30 while being communicated with the space 31. In this case, the space 31 has a bottom surface inclined toward a connecting portion of the liquid refrigerant discharge pipe 50. In this case, the bottom wall of the etching chamber 10 is composed of a bottom wall 13 formed with an opening through which the electrode 30 can be inserted and removed and a bottom wall 14 having an area to cover the opening 12 and capable of being air-tightly mounted on and removed from the bottom wall 13. The electrode 30 is provided on the bottom wall 14 at a position capable of being inserted and removed from the opening 12. The other end of the liquid refrigerant discharge pipe 50 is air-tightly inserted into the bottom wall 14 and protrudes outside the etching chamber 10. A liquid refrigerant supplying device 60 is composed, for example, of a liquid refrigerant source (not shown) and a liquid feed pump (not shown). One end of a liquid refrigerant supplying pipe 61 is connected to a discharge opening of the liquid feed pump. A portion in the midst of the liquid refrigerant supplying pipe 61 is water-tightly inserted into the liquid refrigerant discharge pipe 50, and the other end thereof is opened in the vicinity of the upper surface of the space 31. A liquid refrigerant supplying valve 62 is provided on the liquid refrigerant supplying pipe 61. A pressurized gas supplying device 70 comprises, in this case, a pressurized gas source. One end of a pressurized gas supplying pipe 71 is connected to a pressurized gas supplying opening of the pressurized gas supplying device 70, and the other end thereof is connected, in this case, to the liquid refrigerant supplying pipe 61 at the rear flow side of the liquid refrigerant supplying valve 62. A pressurized gas supplying valve 72 is provided on the pressurized gas supplying pipe 71. One end of a liquid refrigerant recover pipe 80 is connected to the other end of the liquid refrigerant discharge pipe 50 while the other end thereof is connected to a liquid refrigerant source. A liquid refrigerant recovery valve 81 is provided on a liquid refrigerant recovery pipe 80. A gas discharge pipe 90 is inserted into the etching chamber 10, and one end thereof is opened in the vicinity of the upper surface of the space 31. A portion in the midst of the gas discharge pipe 90 is air- and water-tightly provided on the bottom of the electrode 30, and the other portion in the midst thereof is air-tightly provided on the bottom wall 14. A gas discharge valve 91 is provided on a gas discharge pipe 90 outside the etching chamber 10. In this case, the other end of the gas discharge pipe 90 is opened to the atmosphere. It is noted that in the case where the liquid refrigerant supplying device 60 is composed of a liquefied freezer, the other end of the gas discharge pipe 90 is connected to an intake vent of a compressor constituting a liquefied freezer. In such a case, boosted gas compressed by the compressor can be supplied to the pressurized gas supplying pipe 71, said boosted gas being used as a pressurized gas. In this case, the electrode 20 is grounded, and the electrode 30 is connected to a power source, in this case, a high frequency power source 100. The high frequency power source 100 is installed outside the etching chamber 110. The high frequency power source 100 is grounded. In this case, a heat transfer plate 110 is provided on the specimen place surface of the electrode 30. The heat transfer plate 110 is formed of a material having a good heat conductivity. In this case, a heater 120 is embedded in the electrode 30 between the upper surface of the space 31 and the surface on which the heat transfer plate 110 is placed. A current introducing terminal of the heater 120 is connected to a current supplying source (not shown) through a current adjuster (not shown).

In FIG. 1, it is first assumed that there is no liquid refrigerant in the space 31, a temperature is in a normal state, and a specimen 130 is not placed. When the vacuum pump is actuated, the interior of the etching chamber 10 is reduced in pressure and exhausted, and the interior of the etching chamber 10 is adjusted to a predetermined pressure by means of a variable conductance valve. On the other hand, the specimen 130 such as a substrate of a semiconductor, a single one in this case, is introduced into the etching chamber by means of a known introducing means (not shown). The thus introduced specimen 130 is placed on the heat transfer plate 110 with the surface to be etched directed upward. The specimen 130 placed on the heat transfer plate 110 is pressed against the heat transfer plate 110 with the outer peripheral portion thereof pressed by a specimen keep member 140. On the other hand, the liquid feed pump is actuated to open the liquid refrigerant supplying valve 62. In this case, the pressurized gas supplying valve 72, the liquid refrigerant recovery valve 81 and the gas discharge valve 91 remain closed. Thereby, the liquid refrigerant whose temperature is not higher than 0° C., for example, liquid nitrogen is supplied to the space 31 by passing through the liquid refrigerant supplying pipe 61. At the outset of supplying the liquid nitrogen as described above, since the electrode 30 is at a normal temperature, the liquid nitrogen is vaporized and the pressure in the space 31 increases so that the liquid nitrogen cannot be supplied, and therefore the gas discharge valve 91 is opened. Thereby, the nitrogen gas in the space 31 passes through the gas discharge pipe 90 and is discharged outside the space 31 to prevent pressure in the space from being increased. By the supply of the liquid nitrogen to the space 31, the electrode 30 is cooled to a temperature in the vicinity of a temperature of liquid nitrogen, and the specimen 130 is cooled through the heat transfer plate 110. On the other hand, the gas supplying valve 43 is opened, and a predetermined etching gas in a predetermined flow rate is supplied from the gas supplying device 40 to the etching chamber 10. The pressure within the etching chamber 10 to which is supplied the etching gas is adjusted to a predetermined etching pressure by means of the variable conductance valve. In this state, a high frequency voltage is applied from a high frequency power source 100 to the electrode 30, and a glow discharge occurs between the electrodes 20 and 30. The etching gas within the etching chamber 10 is formed into a plasma by the aforesaid glow discharge. The surface to be subjected to etching of the specimen 30 being cooled to a predetermined temperature is treated by etching utilizing a plasma gas. When the etching treatment reaches an etching terminal, the gas supplying valve 43 is closed to stop application of a high frequency voltage to the electrode 30. The specimen 130 having already been subjected to etching treatment is released from its pressing by the specimen keep member 140 and delivered to the transfer means, after which is delivered outside the etching chamber 10 by the transfer means. Thereafter, a new specimen 130 is introduced into the etching chamber 10 by the transfer means and placed on the heat transfer plate 110 of the electrode 30 being cooled to a temperature in the vicinity of a temperature of liquid nitrogen. Thereafter, the above-described operation is again carried out.

In the case where the liquid nitrogen in the space 31 must be discharged outside the space 31 for some reason, the operation of the liquid feed pump of the liquid refrigerant supplying device 60 is stopped and the liquid refrigerant supplying valve 62 is closed. Thereafter, the pressurized gas supplying device 70 starts to operate, and the pressurized gas supplying valve 72 and the liquid refrigerant recovery valve 81 are opened. Thereby, the supply of the liquid nitrogen to the space 31 is stopped, and the pressurized gas; for example, pressurized dry air is supplied to the space 31. Gas pressure in the space 31 is increased by the supply of such pressurized gas. The liquid nitrogen in the space 31 is discharged in the liquid state forcibly and rapidly from the space 31 by virtue of the gas pressure, and the thus discharged liquid nitrogen is recovered into a liquid nitrogen tank which is a liquid refrigerant source of the liquid refrigerant supplying device 60 passing through the liquid refrigerant discharge pipe 50 and the liquid refrigerant recovery pipe 80.

As such cases, the following can be mentioned:

(1) The operation of apparatus is stopped until the next day's operation starts.

(2) The operation of apparatus is stopped when the apparatus is maintained and checked.

(3) The apparatus is stopped.

(4) Etching treatment at a temperature higher than 0° C. and etching treatment at a temperature not higher than 0° C. are repeatedly carried out with respect to the same specimen.

(5) After etching treatment of the same specimen at a temperature not higher than 0° C., etching treatment is successively carried out at a temperature higher than 0° C.

(6) A specimen is subjected to a multi-etching treatment comprising etching treatment at a temperature not higher than 0° C. and etching treatment at a temperature higher than 0° C., and other specimen is successively subjected to similar multi-etching treatment.

(7) A specimen is subjected to etching treatment at a temperature not higher than 0° C., and another specimen is successively subjected to etching treatment at a temperature higher than 0° C.

(8) For the maintenance and check of apparatus, the etching chamber 10 is opened to the atmosphere, whereby the electrode 30 is exposed to atmosphere.

In the above-described cases (1) to (8), the liquid nitrogen in the space 31 is recovered in the liquid state by the liquid refrigerant supplying device 60 without being vaporized and released, and therefore, an increase in consumption quantity of liquid nitrogen can be suppressed, and an increase in operating cost of apparatus can be suppressed.

In the above-described cases (4) to (7), since the liquid nitrogen in the space 31 is forcibly and rapidly discharged from the space 31 by the gas pressure, the time for discharging the liquid nitrogen from the space 31 can be shortened. Accordingly, the time required to control the temperature of a specimen can be shortened, and the lowering of operating efficiency and thus the lowering of throughout can be suppressed.

In the above-described case (8), the following operation is carried out.

Upon termination of the operation for discharging the liquid nitrogen from the space 31, a supply of a current from a current supply source to the heater 120 starts and the heater 120 generates heat. By the heat generation of the heater 120, the electrode 30 and the heat transfer plate 110 are increased in temperature, in which case, the temperature is returned, because the etching chamber 10 is opened to atmosphere, to a normal temperature which is a temperature higher than a dew point temperature of moisture or the like in the atmosphere constituting an atmospheric gas around the electrode 30 and the heat transfer plate 110. After returning to the normal temperature of the electrode 30 and the heat transfer plate 110, a supply of a current to the heater 120 is stopped. In this state, the specimen 130 is not placed on the heat transfer plate 110. On the other hand, the operating of the vacuum pump is stopped, and a leak gas is supplied from a leak gas source (not shown) into the etching chamber 10. Thereafter, the bottom wall 14 is removed from the bottom wall 13, and the electrode 30 and the heat transfer plate 110 are removed outside the etching chamber 10 passing through the opening 12 and exposed to the atmosphere.

In such a case, the electrode 30 and the heat transfer plate 110 which had been cooled to a temperature in the vicinity of a temperature of liquid nitrogen are exposed to the atmosphere after they are returned to a normal temperature and, therefore, adsorption of the moisture or the like from the atmosphere to the electrode 30 and the heat transfer plate 110 can be prevented. Accordingly, an increase in time required for pressure reduction and exhaust within the etching chamber 10 after maintenance and check of the apparatus can be prevented, and the interior of the etching chamber 10 can be reduced in pressure and exhausted to a predetermined pressure. Furthermore, the time for discharging liquid nitrogen from the space 31 and the time for returning the electrode 30 and transfer heat plate 110 to a normal temperature can be shortened, and, therefore, the time required for maintenance and check of the apparatus can be shortened, and lowering of the operating efficiency and thus the lowering of throughput can be suppressed. In view of removing the bad influence on the vacuum state as described above, the forcible and rapid discharge of the liquid nitrogen from the space 31 and the recovery of the liquid nitrogen from the space 31 are not always essentially required.

While in FIG. 1, other refrigerant supply systems and reheating-medium supplying systems are not shown, it is noted that they are naturally required in the above-described cases (4) to (7). For example, the electrode 30 and the heat transfer plate 110 are cooled to a temperature in the vicinity of liquid nitrogen, and in the case of water cooling, the apparatus shown in FIG. 1 is provided with a cooling water supplying system. Further, in the case where it is necessary to change and control, when the same specimen is subjected to plasma etching treatment, a temperature of the specimen to a temperature not higher than 0° C., for example, a temperature in the vicinity of a temperature of liquid nitrogen and a temperature in the vicinity of a temperature of a liquefied fluorine compound, a liquefied fluorine compound supplying device is installed in the FIG. 1 structure. In this case, one end of the other liquid refrigerant supplying pipe is connected to a liquid supplying opening of the liquefied fluorine compound supplying device and the other end thereof is merged and connected to the liquid refrigerant supplying pipe 61 at the rear flow side of the liquid refrigerant supplying pipe 62 shown in FIG. 1. One end of the other liquid refrigerant recovery pipe is connected to a liquid recovery opening of the liquefied fluorine compound supplying device, and the other end thereof is merged and connected to the liquid refrigerant recovery pipe 80 at the front flow side of the liquid refrigerant recovery valve 81 shown in FIG. 1. In such a structure, the same specimen can be subjected to plasma etching treatment at a different temperature not higher than 0° C. and a different specimen can be subjected to plasma etching treatment at a different temperature not higher than 0° C. Furthermore, the time required to change and control the aforementioned temperature can be shortened, and lowering of the operating efficiency of apparatus and thus lowering of the throughout can be suppressed.

While in the above-described first embodiment, a description has been made of the case where the invention is applied to the etching device which uses means for forming an etching gas into a plasma by the action of a high frequency electric field, it is to be noted that it can be applied to an etching device which uses means for forming an etching gas into a plasma by the action of an ac electric field or a dc electric field to obtain an effect similar to the above. Moreover, the invention can be applied to an etching device which uses means for forming an etching gas into a plasma by the action of an electric field and a magnetic field such as means for forming an etching gas into a plasma by a magnetron discharge, for example.

Figure 2:
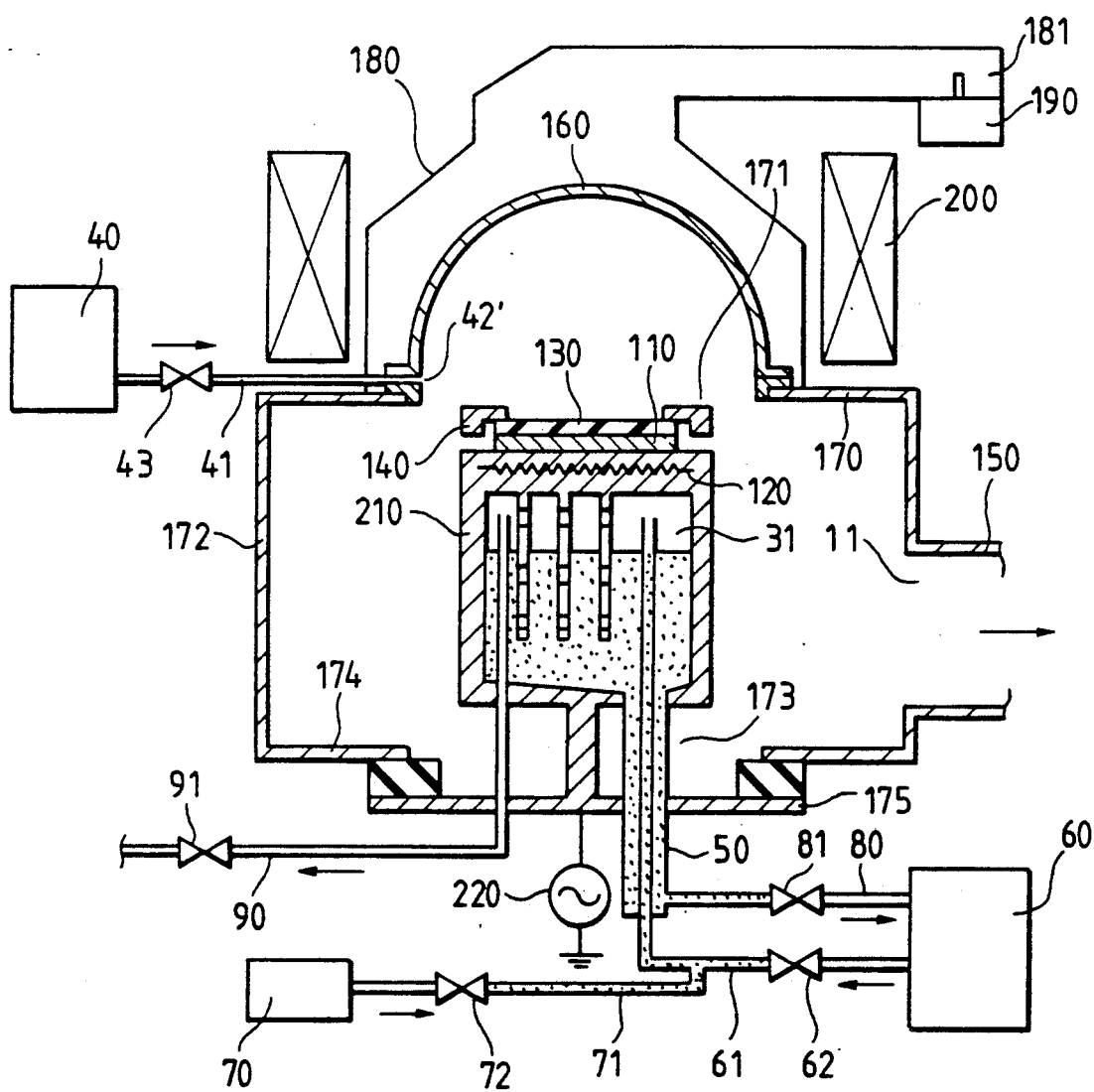
FIG. 2 is a structural view of a plasma etching apparatus according to the second embodiment of the present invention.

FIG. 2 shows a second embodiment of the present invention, which is different from the above-described first embodiment shown in FIG. 1 as follows:

In FIG. 2, a discharge tube 160 is communicated with the interior of a vacuum chamber 172, which is formed with an opening 171 in a top wall 170, and air-tightly designed. Externally of the discharge tube 160 is provided a waveguide 180 interiorly including the discharge tube 160. In this case, the waveguide 180 and a microwave oscillator 190 are connected by a waveguide 181. A magnetic field producing means, for example, a solenoid coil 200 is provided externally of the waveguide 180. A gas supplying passage 42' is provided at a position where the discharge tube 180 and the vacuum chamber 172 are provided. On the other hand, a bottom wall of the vacuum chamber 172 is composed of a bottom wall 174 formed with an opening 173 through which a specimen table 210 can be inserted and removed and a bottom wall 175 having an area enough to cover the opening 173 and air-tightly and detachably disposed on a bottom wall 174. The specimen table 210 is provided on the bottom wall 175 at a position capable of being inserted and removed from the opening 173. The other end of the liquid refrigerant discharge pipe 50 is air-tightly inserted into the bottom wall 175 and protrudes outside the vacuum chamber 172. A gas discharge pipe 90 is inserted into the vacuum chamber 172 and other portions in the midst thereof are air-tightly provided on the bottom wall 175. It is to be noted that in FIG. 2, the same devices and parts as those shown in FIG. 1 are indicated by the same reference numerals, which are not explained further.

In FIG. 2, a microwave discharge having a magnetic field is generated in the discharge tube 160 by the action of the microwave electric field and magnetic field, and an etching gas within the discharge tube 160 is formed into a plasma by the microwave discharge. The specimen 130 is cooled by the operation similar to that used in the first embodiment, and the surface subjected to etching is subjected to etching treatment utilizing a gas plasma. In this case, the incident energy of ions in the gas plasma onto the surface subjected to etching is controlled in such a manner that a bias voltage is adjusted by a power source connected to the specimen table 210, for example, a high frequency power source 220. Other operations will be omitted from explanation since they are similar to those described in the first embodiment.

In the second embodiment, an effect similar to that of the first embodiment can be obtained. In the second embodiment, the pressure in the discharge tube and vacuum chamber is further lower than that within the etching chamber in the first embodiment, and therefore, in the above-described case (8), it will be further effective in terms of removal of the bad influence on the vacuum performance.

While in the second embodiment, the case where the invention is applied to the microwave plasma etching device having the magnetic field has been described, it is to be noted that the invention can be applied to the microwave plasma etching device having no magnetic field to obtain the similar effect.

Furthermore, while in the first and second embodiments, the description has been made taking an example in which a specimen controlled to a low temperature not higher than 0° C. is subjected to etching treatment utilizing a gas plasma, it is to be noted that the invention is similarly applied to the case where a specimen controlled to a low temperature not higher than 0° C. is subjected to film-forming treatment such as CVD and sputtering film-forming utilizing a gas plasma.

According to the present invention, since an increase in consumption quantity of a liquid refrigerant can be suppressed, there can be obtained the effect in that an increase in operating cost of the apparatus for controlling a temperature of a specimen to a low temperature not higher than 0° C. to treat the specimen utilizing a gas plasma.

Moreover, it is possible to prevent adsorption of an atmospheric gas around the specimen table toward the latter when the apparatus is stopped or out of operation, and therefore, there can be obtained the effect in that the reduction in pressure and exhaust within the treating chamber after stoppage or suspension of operation of the apparatus for controlling a temperature of a specimen to a low temperature not higher than 0° C. to treat the specimen utilizing a gas plasma can be well carried out.

What is claimed is:

1. A plasma treating method comprising the steps of supplying a liquid refrigerant whose temperature is not higher than 0° C. into a specimen table having a specimen place surface; cooling a specimen placed on said specimen place surface; treating the thus cooled specimen utilizing a gas plasma; supplying a pressurized gas into said specimen table and thereby discharging said liquid refrigerant retained in said specimen table outside said speciment table; and returning a temperature of said specimen table, including said specimen place surface, from which said liquid refrigerant is discharged from a temperature lower than 0° C. to a temperature higher than a dew point temperature under atmospheric pressure of an atmospheric gas around said specimen table.

2. A plasma treating method according to claim 1, wherein when the apparatus for treating said specimen utilizing said gas plasma is maintained and checked, said liquid refrigerant is discharged outside said specimen table, and a temperature of said specimen table, including said specimen place surface, from which said liquid refrigerant is discharged is returned from a temperature lower than 0° C. to a temperature higher than a dew point temperature under atmospheric pressure of an atmospheric gas around said specimen table by heating said specimen table.

3. A plasma treating method according to claim 2, wherein after a temperature of said specimen table from which said liquid refrigerant is discharged is returned from a temperature lower than 0° C. to a temperature higher than a dew point temperature under atmospheric pressure of moisture in an atmosphere chamber interiorly provided with said specimen table is opened to the atmosphere.

4. A plasma treating apparatus comprising means for producing a gas plasma, a treating chamber, a specimen table provided within said treating chamber and having a specimen place surface on which is placed a specimen to be treated utilizing said gas plasma and interiorly formed with a space for retaining a liquid refrigerant whose temperature is not higher than 0° C., means for supplying said liquid refrigerant to said space, means for supplying a pressurized gas into said space and thereby discharging said liquid refrigerant retained in said space outside said specimen table, and means for returning a temperature of said specimen table, including said specimen place surface, from a temperature lower than 0° C. to a temperature higher than a dew point temperature under atmospheric pressure of an atmospheric gas within a treating chamber interiorly provided with said specimen table.

5. A plasma treating apparatus according to claim 4, wherein said liquid refrigerant discharge means comprises means for discharging said liquid refrigerant retained in said space in its liquid state outside said specimen table.

6. A plasma treating apparatus according to claim 5, further comprising means for storing said liquid refrigerant, wherein said liquid refrigerant discharge means discharges said liquid refrigerant thereto and said means for supplying said liquid refrigerant supplies said liquid refrigerant therefrom.

7. A plasma treating apparatus in which one end of a liquid refrigerant supplying pipe provided with a liquid refrigerant supplying valve is connected to a liquid refrigerant supplying device, the other end of said liquid refrigerant supplying pipe being opened within a liquid refrigerant retaining space formed in a specimen table having a specimen place surface on which is placed a specimen to be treated utilizing a gas plasma, one end of a pressurized gas supplying pipe provided with a pressurized gas supplying valve is connected to a pressurized gas supplying device, the other end of said pressurized gas supplying pipe being opened within said space, one end of a gas discharge pipe provided with a gas discharge valve is opened within said space, one end of a liquid refrigerant recovery pipe provided with a liquid refrigerant recovery valve is connected to said liquid refrigerant supplying device, the other end of said liquid refrigerant recovery pipe being opened within said space, and a heater for heating said specimen table, including said specimen place surface, from which said liquid refrigerant is discharged to return a temperature of said specimen table from a temperature lower than 0° C. to a temperature higher than a dew point temperature under atmospheric pressure of an atmospheric gas around said specimen table, is provided on said specimen table.

8. A plasma treating method comprising the following series of steps:
   providing a treating chamber having a specimen table located therein, said specimen table having an interior space to which a liquid refrigerant can be supplied, having a specimen place surface on which a specimen is placed and having a heater for heating said specimen table, including said specimen place surface;
   supplying a liquid refrigerant whose temperature is not higher than 0° C. into said interior space of said specimen table, thereby cooling said specimen table and said specimen;
   treating the cooled specimen in a gas plasma;
   supplying a pressurized gas into said interior space of said specimen table, thereby discharging said liquid refrigerant from said interior space of said specimen table;
   heating said specimen table, including said specimen place surface, from which said liquid refrigerant is discharged to a predetermined temperature using said heater; and
   opening said treating chamber to the atmosphere;
   wherein said predetermined temperature is above dew point temperature of moisture in said atmosphere, whereby adsorption of said moisture from said atmosphere to said specimen table can be prevented.

9. A plasma treating method according to claim 8, further comprising closing said treating chamber; reducing a pressure inside said treating chamber; supplying said liquid refrigerant, including liquid refrigerant previously discharged from said specimen table, to the interior of said specimen table, thereby cooling said specimen table and a specimen provided thereon; and treating said specimen in a gas plasma.

* * * * *